United States Patent [19]
Allfather

[11] Patent Number: 5,541,827
[45] Date of Patent: Jul. 30, 1996

[54] REDUCING SWITCHING LOSSES IN A PHASE-MODULATED SWITCH-MODE AMPLIFIER

[75] Inventor: Lars P. Allfather, Boston, Mass.

[73] Assignee: Doble Engineering Company, Watertown, Mass.

[21] Appl. No.: 442,685

[22] Filed: May 17, 1995

[51] Int. Cl.⁶ .......................... H02M 3/335; H02M 3/24
[52] U.S. Cl. ................................. 363/17; 363/98
[58] Field of Search ..................... 363/16, 17, 97, 363/98, 131, 132

[56] References Cited

U.S. PATENT DOCUMENTS

| | | | |
|---|---|---|---|
| 4,992,751 | 2/1991 | Attwood et al. | 330/10 |
| 5,231,563 | 7/1993 | Jitaru | 363/98 |
| 5,255,174 | 10/1993 | Murugan | 363/17 |
| 5,400,235 | 3/1995 | Carroll | 363/17 |
| 5,430,632 | 7/1995 | Meszlenyi | 363/17 |
| 5,438,498 | 8/1995 | Ingemi | 363/17 |
| 5,442,540 | 8/1995 | Hua et al. | 363/98 |

OTHER PUBLICATIONS

Zoltan Zansky, Phase–modulated ac supply exhibits high efficiency, EDN Oct. 3, 1984, pp. 177–180.

*Primary Examiner*—Matthew V. Nguyen
*Attorney, Agent, or Firm*—Fish & Richardson P.C.

[57] ABSTRACT

A switching amplifier circuit includes a tri-state switching circuit receiving a DC voltage signal and having first electrical switches responsive to first control signals and providing a differential AC voltage waveform at a predetermined frequency alternating between a positive DC voltage, negative DC voltage and a zero voltage. The switching amplifier further includes a rectifier circuit having second electrical switches responsive to second control signals for receiving the differential AC voltage output waveform from the tri-state switching circuit and providing a desired output signal. The second control signals are applied to switch the second electrical switches only when the first electrical switches of the tri-state switching circuit are in the zero voltage state.

14 Claims, 3 Drawing Sheets

REDUCING SWITCHING LOSSES IN A PHASE-MODULATED SWITCH-MODE AMPLIFIER

BACKGROUND OF THE INVENTION

This invention relates to reducing switching losses in a phase-modulated switch mode amplifier.

Phase modulation techniques have been used for controlling switching power supplies. For example, Zansky, "Phase-modulated ac supply exhibits high efficiency", EDN, October 1985, describes using phase modulating techniques to generate lower-energy transients, thereby increasing efficiency.

SUMMARY OF THE INVENTION

The invention provides an efficient phase-modulated switch mode amplifier circuit having a rectifier which is always switched at a zero voltage crossing, thereby significantly reducing the switching losses in the circuit. Reducing the switching losses permits operating the switch mode amplifier circuit at higher switching frequencies. Operation at higher frequencies allows the use of smaller components, an attractive feature for applications (e.g., lap top computers) where weight, size, and efficiency are important considerations.

In one aspect of the invention, a switching amplifier circuit includes a tri-state switching circuit receiving a DC voltage signal and having first electrical switches responsive to first control signals and providing a differential AC voltage waveform at a predetermined frequency alternating between a positive DC voltage, negative DC voltage and zero voltage. The switching amplifier further includes a rectifier circuit having second electrical switches responsive to second control signals for receiving the differential AC voltage output waveform from the tri-state switching circuit and providing a desired output signal.

In exemplary embodiments, the invention includes one or more of the following features. The first electrical switches of the inverter circuit include first and second switches, responsive to first and second control signals, respectively, in the form of square wave pulse trains, with the second control signal being the complement of the first control signal. The first electrical switches also include third and fourth switches, responsive to third and fourth control signals, respectively, in the form of square wave pulse trains, with the fourth control signal being the complement of the third control signal. The second electrical switches of the rectifier circuit include fifth and sixth switches, respectively, responsive to fifth and sixth control signals in the form of square wave pulse trains, with the sixth control signal being the complement of the fifth control signal. In operation, the first, second, third, and fourth control signals have a differential phase shift with respect to the fifth and sixth control signals. The switching devices may be MOSFET devices.

The fifth and sixth switches of the rectifier circuit are controlled to switch only when the switches of the tri-state inverter circuit have a zero voltage across them, thereby reducing switching losses of the devices. The tri-state inverter is galvanically isolated from the rectifier circuit using, for example, a transformer to isolate the power supply source from the load.

In another embodiment, the switching amplifier circuit includes a plurality of rectifier circuits, each coupled to the tri-state inverter circuit and each including second electrical switches responsive to second control signals for receiving the differential AC voltage output waveform and providing a desired output signal. The switching amplifier may also include a switch matrix for receiving and combining each of the outputs from the rectifier circuits to generate a wide variety of output levels. The outputs of the rectifier circuits may be combined in parallel, in series, or combinations of both.

In another aspect of the invention, a method of reducing switching losses in a switching amplifier circuit of the type described above includes applying a first plurality of control signals to the tri-state switching circuit, receiving a DC voltage to provide a differential AC voltage waveform at a predetermined frequency alternating between a positive DC voltage, negative DC voltage and zero voltage state, and applying second control signals to the rectifier circuit receiving the alternating AC voltage waveform from the tri-state inverting circuit to provide a desired output signal from the switching amplifier. The second control signals are applied to switch the second electrical switches only when the first electrical switches of the tri-state switching circuit are in the zero voltage state.

Other features, objects and advantages of the invention will become apparent from the following description when read in connection with the accompanying drawings in which:

DETAILED DESCRIPTION

Figure 1:
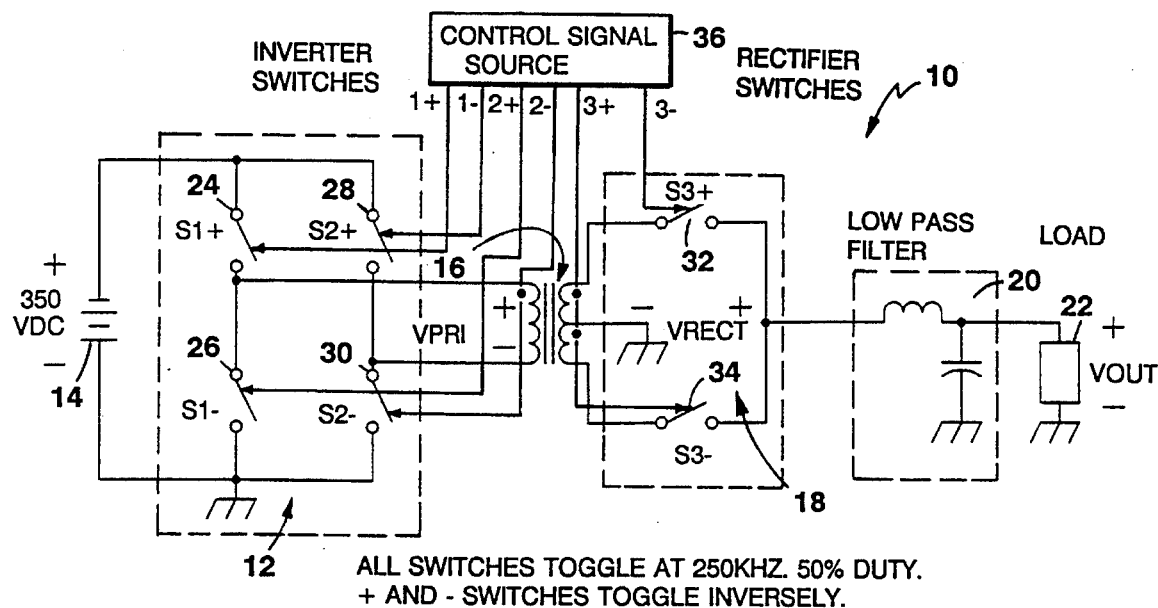
FIG. 1 is a schematic diagram of the switch mode amplifier circuit of the present invention in its basic form.

Referring to FIG. 1, there is shown a schematic diagram of a phase-modulated switch mode amplifier or power supply 10 including a tri-state inverter circuit 12 which receives a DC signal from a power supply 14 (350 VDC) and generates an AC waveform. The AC waveform is applied, via a transformer 16, to a phase-modulated synchronous rectifier circuit 18 and low pass filter 20 which filters signals above a predetermined frequency to provide an average DC component signal to a load 22. Transformer 16 provides impedance matching between the inverter and rectifier circuit. Switch mode amplifiers with such a DC-AC-DC interconnection of this type may be used to provide control of both the voltage and current output.

Tri-state inverter circuit 12 includes four switching power devices 24, 26, 28, 30, arranged in a configuration similar to that of a conventional single-phase full-bridge inverter. Rectifier circuit 18 similarly includes a pair of switching power devices 32, 34 arranged in a conventional full-wave rectifier configuration. The switching devices 24, 26, 28, 32, 34 are driven by independent control circuits 36 each of which provides, square wave pulse trains having a 50% duty cycle on lines 1+, 1−, 2+, 2−, 3+, 3−, to switches S1+, S1−, S2+, S2−, S3+, S3−, respectively.

Figure 2C:
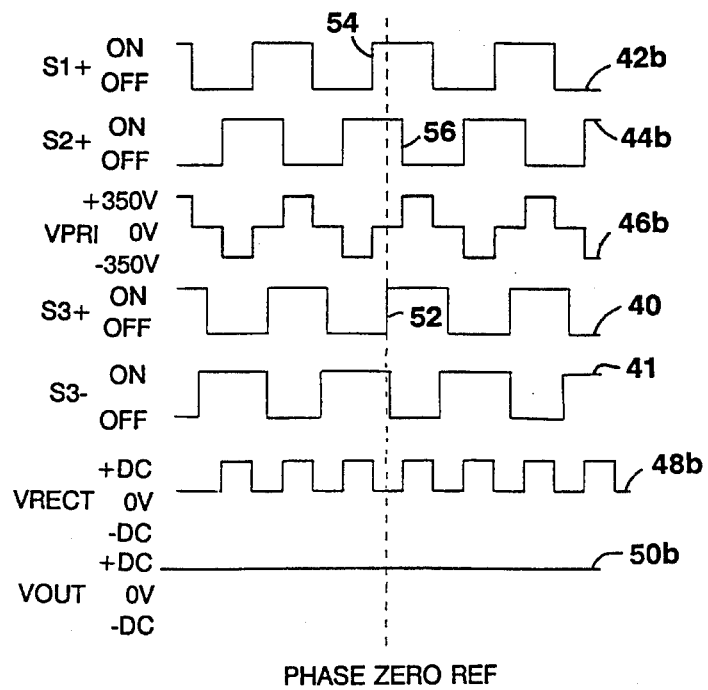
FIGS. 2A–2C are timing diagrams for the drive signals used to provide a desired output from the switch mode amplifier of FIG. 1.
Figure 2A:
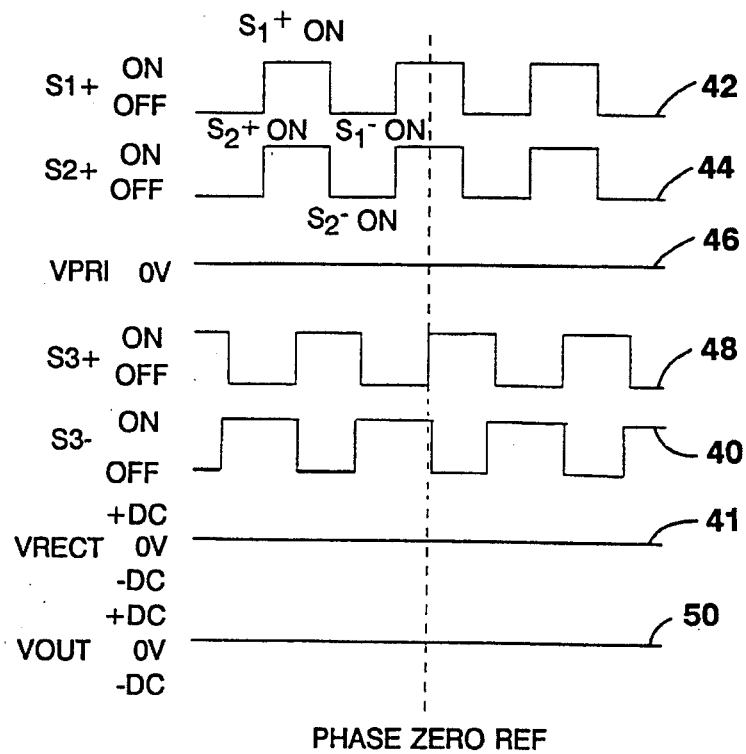
Figure 2B:
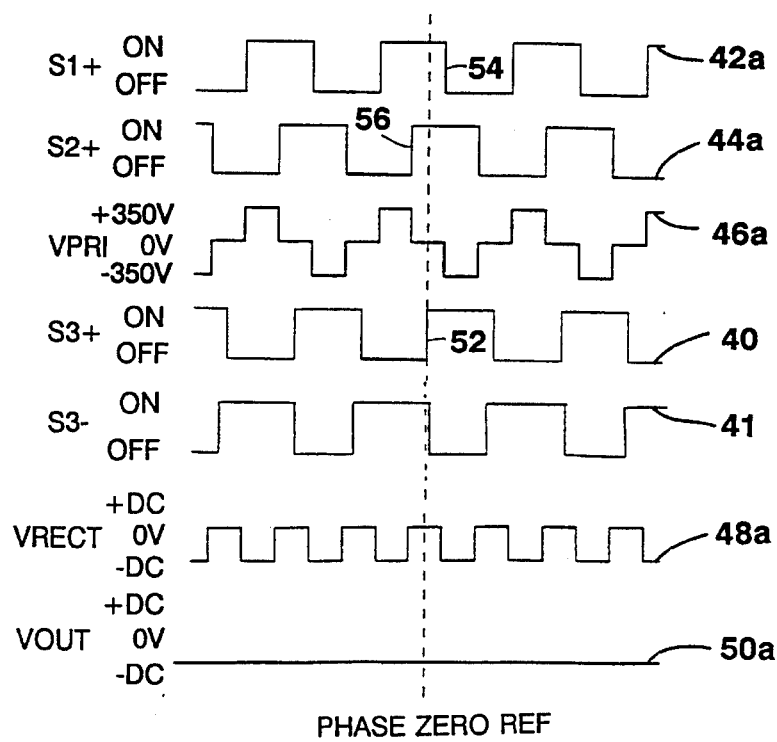

By controlling the differential phase between the pulse trains applied to switching devices 24, 26, 28, 30 with respect to the pulse trains applied to switching devices 32, 34, the current and voltage of the output can be varied over a relatively wide range. Referring to FIGS. 2A–2C, there are shown a graphical representation of signal waveforms plotted to respective common time scales helpful in understanding the operation of the circuit of FIG. 1. Waveforms 40, 41 are typically 250 kHz square wave pulse trains, each having a duty cycle of 50% applied to switch devices 32 and 34, respectively. These pulse trains are essentially 180° out of phase so that devices 32, 34 of rectifier 18 toggle inversely. To prevent both switch devices 32, 34 from being open simultaneously the duration of the pulses of waveform 41 is slightly greater than 50% to create a slight interval in which both switch devices 32, 34 are on. Similarly, waveforms 42, 44 are square wave pulse trains (of the same frequency as pulse trains 40, 41, respectively) applied to switch devices 24, 26 and 28, 30 of inverter 12, respectively. Here again, devices 24, 26 toggle inversely with respect to each other, and devices 28, 30 toggle inversely with respect to each other.

Referring now to FIG. 1 and FIG. 2A, pulse trains 42, 44 are in phase with each other and 90° out of phase with respect to pulse train 40. With this phase relationship, no voltage is impressed across the primary of transformer 16 (waveform 46). Because the transformer does not provide any phase shift to the voltage from the inverter, the voltage across the secondary is a stepped-up or stepped-down version of the voltage across the primary. With no voltage across the primary there is no voltage across the secondary of the transformer. Thus, the rectifier output voltage (waveform 48) and resultant output voltage (waveform 50) at load 22 are also zero. This feature is particularly advantageous in applications for generating low level signals. An advantage of the invention in the zero DC voltage condition, as shown in FIG. 2A, is exceptionally low AC ripple. As a result, the signal-to-noise ratio at the zero output level condition is exceptionally high, allowing use of smaller output filters.

Referring to FIG. 2B, there is shown a graphical representation of signal waveform conditions for providing a negative output voltage. Waveforms at the same points in the circuit of FIG. 1 are identified by the same reference numerals as in FIG. 2A with an appended a. Pulse trains 42a, 44a are phase shifted with respect to each other and in opposite directions. For example, a leading edge 54 of a pulse of pulse train 42a "leads" the leading edge 52 of an associated reference pulse of pulse train 40. Similarly, a leading edge 56 of a pulse of pulse train 44a "lags" leading edge 52 of the same reference pulse of pulse train 40. Providing a differential phase shift between pulse trains 42, 44 causes a differential voltage (waveform 46a) to be impressed across the transformer primary which alternates between +350 volts (from supply 14), zero voltage and −350 volts. Waveform 46a rectified at the switching rate and particular phase differential between pulse trains 40 and 42 provides a square wave 48a alternating between zero volts and a negative DC voltage. Waveform 48a is filtered to provide an average negative DC voltage level waveform 50a.

Referring to FIG. 2C, there is shown a graphical representation of signal waveform conditions providing a positive output voltage. Waveforms at the same points in the circuit of FIG. 1 are identified by the same reference numerals as in FIGS. 2A and 2B with an appended b. When pulse trains 42b, 44b are differentially phase shifted in the opposite sense to that shown in FIG. 2B (i.e., leading edge 54 of a pulse of pulse train 42b "lags" while a leading edge 56 of a pulse of pulse train 44b "leads" leading edge 52 of a pulse of pulse train 40), waveform 46b is generated which is a phase shifted version of waveform 46a. With this phase relationship, square wave 48b alternates between zero volts and a positive DC voltage. Waveform 48b is filtered to provide an average positive DC voltage level waveform 50b.

FIGS. 2A–2C show that switching devices 32, 34 of rectifier 18 switch only when the voltage to be rectified (Vpri) is zero. Zero-voltage switching according to the invention reduces the switching losses within the MOSFET devices which can be substantial, particularly in high power applications such as, for example, driving adjustable speed motor drives.

Figure 3:
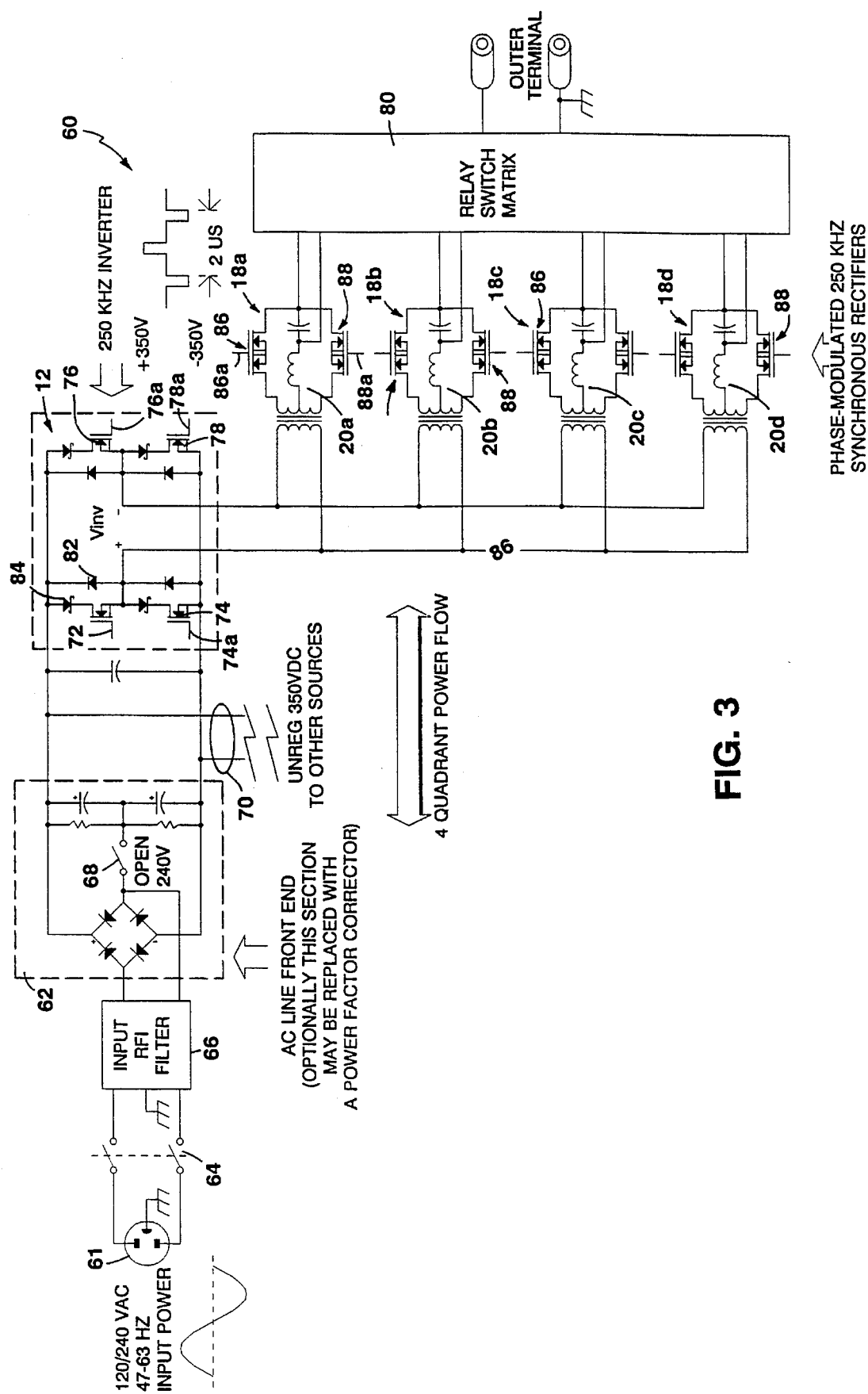
FIG. 3 illustrates a more detailed schematic diagram of the switch mode amplifier of FIG. 1.

Referring to FIG. 3, the phase-modulated switch mode amplifier of FIG. 1 is shown used in a power conversion system 60. Line voltage AC power from either a 120 V or 240 V source 61 is provided to an AC front end 62 through a circuit breaker 64 and optional RFI filter 66. AC front end 62 is a conventional full-wave bridge rectifier for generating a nominal 350 VDC supply and includes a switch 68 which is closed when the AC source is 120 VAC. The rectified 350 VDC is provided to a 250 kHz switching inverter 12, as shown in FIG. 1, as well as to other sources along lines 70.

Switching inverter 12 includes high power switching MOSFET devices 72, 74, 76, 78 (typically Motorola MTA5N50E MOSFET devices) having gate electrodes 72a, 74a, 76a, 78a, respectively, for receiving control signals from control signal source 36 (FIG. 1) in the form of pulse trains 42, 44 as shown in FIGS. 2A–2C. Each of the MOSFET devices 72, 74, 76, 78 includes a built-in drain-source diode provided intrinsically in the fabrication of the MOSFET device. This intrinsic diode (not shown), has its anode and cathode connected to the drain and source of the MOSFET, respectively. However, because the intrinsic diode has a relatively slow switching speed characteristic, a faster diode 82 is provided across each MOSFET device with an additional Schottky diode 84 connected between the anode of the fast switching diode and the intrinsic diode to isolate the MOSFET devices and prevent current sharing.

Power conversion system 60 also includes four identical 250 kHz phase-modulated synchronous rectifiers 18a–18d each with associated low pass filters 20a–20d. Each rectifier includes a pair of MOSFET devices 86, 88 (typically Motorola MTP60NO6HD MOSFET devices) having gate electrodes 86a, 88a for receiving the same control signals commensurate with pulse trains 40, 41 of FIGS. 2A–2C which in conjunction with appropriate phase shifting of MOSFETs 72–78 of inverter 12 provide a DC voltage at a given current level. Various combinations of the outputs of each rectifier 18a–18d are provided using a relay switch matrix 80. For example, assuming that each rectifier provides a voltage output of 5 volts at 7.5 amps, if combined in parallel, switch matrix provides a 5 volt, 30 amp output and if combined in series provides a 20 volt, 7.5 amp output. Various series/parallel combinations can also be used to provide voltage/current outputs within those extremes.

Other embodiments are within the following claims.

What is claimed is:

1. A phase-modulated switching amplifier circuit comprising:

a source of a DC voltage, a source of control signals of predetermined switching frequency, a tri-state switching circuit coupled to said source of a DC voltage and said source of control signals and comprising a first plurality of switches responsive to a first plurality of said control signals for receiving a DC voltage and providing a differential AC voltage output waveform at said predetermined switching frequency alternating among a positive DC voltage, negative DC voltage and zero voltage characterized by an average value related to the relative phase between certain ones of said first plurality of control signals, and a rectifier circuit comprising a second plurality of electrical switches responsive to a second plurality of said control signals by switching only when said differential AC voltage output waveform is at zero voltage for receiving said differential AC voltage output waveform and providing a desired output signal.

2. The amplifier of claim 1 wherein said first plurality of switches comprises first and second switches responsive to first and second control signals in the form of square wave pulse trains, said second control signal being the complement of said first control signal, and third and fourth switches responsive to third and fourth control signals in the form of square wave pulse trains, said fourth control signal being the complement of said third control signal, and said second plurality of switches comprises fifth and sixth switches responsive to fifth and sixth control signals in the form of a square wave pulse trains, said sixth control signal being the complement of said fifth control signal, and wherein said first, second, third, and fourth control signals have a differential phase shift with respect to said fifth and sixth control signals related to said relative phase.

3. The switching amplifier circuit of claim 1 wherein said rectifier circuit provides a DC output related to said average value.

4. The switching amplifier circuit of claim 1 wherein said rectifier circuit provides an AC output.

5. The switching amplifier circuit of claim 2 wherein said fifth and sixth switches switch when said first through fourth switches have a zero voltage across them.

6. The switching amplifier circuit of claim 1 wherein said tri-state inverter is galvanically isolated from said rectifier circuit.

7. The switching amplifier circuit of claim 6 further comprising a transformer between said tri-state inverter and rectifier circuit galvanically isolating said tri-state inverter from said rectifier circuit.

8. The switching amplifier circuit of claim 1 wherein said switches are MOSFET devices.

9. The switching amplifier circuit of claim 1 further comprising:

a plurality of rectifier circuits, each coupled to said first switching circuit and each comprising a second plurality of electrical switches responsive to a second plurality of control signals for receiving said differential AC voltage output waveform and providing a desired output signal.

10. The switching amplifier of claim 9 further comprising a switch matrix for receiving and combining each of said outputs from said plurality of rectifier circuits.

11. The switching amplifier of claim 10 wherein said outputs of said plurality of rectifier circuits are combined in parallel.

12. The switching amplifier of claim 10 wherein said outputs of said plurality of rectifier circuits are combined in series.

13. A method of reducing switching losses in a switching amplifier circuit comprising the steps of:

connecting a tri-state switching circuit having a first plurality of switches to a rectifier circuit having a second plurality of electrical switches;

applying a first plurality of control signals to said tri-state switching circuit receiving a DC voltage to provide a differential AC voltage waveform at a predetermined frequency alternating between a positive DC voltage, negative DC voltage and a zero voltage state, and applying a second plurality of control signals to said rectifier circuit receiving said alternating AC voltage waveform from said tri-state inverting circuit to provide a desired output signal from said switching amplifier.

14. The method of claim 13 further comprising the step of applying said second plurality of control signals to switch said second plurality of electrical switches only when said first plurality of switches of said tri-state switching circuit are in said zero voltage state.

\* \* \* \* \*